United States Patent
Krusor et al.

(10) Patent No.: US 10,420,222 B2
(45) Date of Patent: Sep. 17, 2019

(54) METHOD FOR BONDING DISCRETE DEVICES USING ANISOTROPIC CONDUCTIVE FILM

(71) Applicant: Palo Alto Research Center Incorporated, Palo Alto, CA (US)

(72) Inventors: Brent S. Krusor, Fremont, CA (US); Ping Mei, San Jose, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 2 days.

(21) Appl. No.: 15/492,230

(22) Filed: Apr. 20, 2017

(65) Prior Publication Data
US 2018/0310415 A1    Oct. 25, 2018

(51) Int. Cl.
H05K 3/32        (2006.01)
H05K 3/00        (2006.01)
H01L 21/683      (2006.01)
B32B 38/10       (2006.01)

(52) U.S. Cl.
CPC ...... *H05K 3/323* (2013.01); *B29C 2793/0054* (2013.01); *B32B 38/10* (2013.01); *H01L 21/6835* (2013.01); *H05K 3/0008* (2013.01); *H05K 2201/10984* (2013.01); *H05K 2203/082* (2013.01)

(58) Field of Classification Search
CPC ............... H05K 13/0069; H05K 13/04; H05K 13/0408; H05K 13/08; H05K 3/323; B32B 38/10; H01L 21/6835; H01L 21/6836; B29C 2793/0054

USPC ......................................... 156/230, 247, 249
See application file for complete search history.

(56) References Cited

U.S. PATENT DOCUMENTS

| | | | | |
|---|---|---|---|---|
| 6,498,051 B1* | 12/2002 | Watanabe | ............... | H01L 24/29 257/704 |
| 8,450,753 B2* | 5/2013 | Shiota | ................ | G02F 1/13452 257/678 |
| 2009/0193650 A1* | 8/2009 | Onitsuka | ................ | H05K 13/02 29/739 |
| 2012/0258311 A1* | 10/2012 | Hong | ..................... | B82Y 30/00 428/408 |
| 2016/0155717 A1* | 6/2016 | Saruyama | ................ | H01R 4/04 428/156 |
| 2016/0257107 A1* | 9/2016 | Yamada | ................ | H05K 3/361 |

FOREIGN PATENT DOCUMENTS

JP      10313024 A   * 11/1998

OTHER PUBLICATIONS

English translation of JP10-313024A.*

* cited by examiner

*Primary Examiner* — Sonya M Sengupta
(74) *Attorney, Agent, or Firm* — Fay Sharpe LLP

(57) ABSTRACT

Methods and system which eliminate steps in the mounting a discrete device to an electronic circuit using a conductive film, shortening the time required to attach each discrete device. The methods place a discrete device onto the conductive tape and partially cure portions of the adhesive. The discrete device is then removed from the conductive tape along with the adhesive and conductive particles which have been transferred onto the contact pads of the discrete device. The discrete device is then placed on the substrate and aligned. Pressure and heat are applied to complete the bond.

18 Claims, 8 Drawing Sheets

METHOD FOR BONDING DISCRETE DEVICES USING ANISOTROPIC CONDUCTIVE FILM

BACKGROUND

The present application is directed to electronic manufacturing and more particularly the bonding of a discrete device to a selected location on a substrate.

Anisotropic conductive film (ACF) is an interconnect technology for mechanically and electrically connecting a discrete device to a substrate. Anisotropic conductive films typically consist of a thermosetting resin with embedded conductive particles on a removable liner. The conductive particles are small in relation to the contact pad area of the device and provide z-axis conductivity and are electrically insulating laterally. An existing bonding sequence which uses ACF, involves placing a properly sized piece of ACF, adhesive side down, on to an area of the substrate where the discrete device is to be bonded, applying a light pressure and enough heat for a few seconds to partially cure the adhesive, thereby tacking the ACF into place. The ACF liner is removed and the discrete device is registered to the connecting traces of the substrate. A sufficient temperature and pressure are applied to complete the cure of the adhesive and mechanically compress the conductive particles to make electrical contact. Among other operations, the foregoing requires sizing and transferring the ACF to the substrate, tacking the ACF, removing the protective liner, registering and placing the discrete device and completing the cure operation.

It is considered that more efficient bonding processes and systems which eliminate steps would be useful. Such methods and systems are presented in the following disclosure.

BRIEF DESCRIPTION

Disclosed is a method of bonding a discrete device to a substrate, the discrete device having contact pads extending from a body portion, and the bonding using a conductive tape. The method includes, providing the conductive tape having a layer of adhesive including conductive particles (or conductive balls) within the layer of adhesive, the layer of adhesive carried on a liner, wherein the layer of adhesive of the conductive tape faces upward; placing the contact pads of the discrete device on the upward facing layer of adhesive of the conductive tape; applying pressure and heat to the discrete device located on the layer of adhesive of the conductive tape, the pressure being sufficient to move the contact pads into the layer of adhesive, and the heat raising the contact pads to a temperature above a tacking temperature of the conductive tape sufficient to alter portions of the layer of adhesive corresponding to areas of the contact pads, wherein the portions of the layer of adhesive corresponding to the areas of the contact pads partially tack the portions of the layer of adhesive to the contact pads; removing the discrete device from the upward facing layer of adhesive of the conductive tape, wherein the portions of the layer of adhesive that have partially cured to the contact pads of the discrete device are carried with the contact pads, and are removed from the liner of the conductive tape; positioning the discrete device with the contact pads carrying the portions of the partially cured adhesive layer onto a surface of a substrate; and applying heat and pressure to the discrete device to complete bonding of the contact pads of the discrete device to the surface of the substrate.

Also disclosed is a method of bonding a discrete device to a substrate, the discrete device having contact pads extending from a body portion, and the bonding a using conductive tape. The method includes, providing the conductive tape having a layer of adhesive including conductive particles (or conductive balls) within the layer of adhesive, the layer of adhesive carried on a liner, wherein the layer of adhesive of the conductive tape faces upward; heating the discrete device at a heating area, the heating raising the contact pads to a temperature above a tacking temperature of the conductive tape; removing the heated discrete device from the heating area; placing the contact pads of the heated discrete device on the upward facing layer of adhesive of the conductive tape; applying a pressure to the heated discrete device for a determined time such that the contact pads and the layer of adhesive are in contact, wherein the temperature of the contact pads is sufficient to modify portions of the layer of the adhesive of the conductive tape associated with the contact pads, wherein the portions of the layer of adhesive partially cure to the contact pads of the discrete device; removing the discrete device from the upward facing layer of adhesive of the conductive tape, wherein the portions of the layer of adhesive that have partially cured to the contact pads of the discrete device are carried with the contact pads, and are removed from the liner of the conductive tape; positioning the discrete device with the contact pads carrying the portions of the partially cured adhesive layer onto a surface of a substrate; and applying heat and pressure to the discrete device to complete bonding of the contact pads of the discrete device to the surface of the substrate.

Another aspect includes the conductive tape being an anisotropic conductive film (ACF).

Another aspect includes the partially cured adhesive layer substantially covering an entire surface of each of the contact pads, sufficient to provide an electrical connection between surfaces of the contact pads and the substrate, wherein the substrate includes conductive traces.

Another aspect includes the applied heat being from between 60 degrees C. to 90 degrees C., and the applied pressure being from approximately 1 MPa to partially cure the adhesive.

Another aspect includes the applied heat being from between 150 degrees C. to 180 degrees C., and the applied pressure being from between 2 to 5 MPa to complete the bonding operation.

Another aspect includes pre-scoring the adhesive layer at pre-positioned locations to match the contact pads of the discrete device, wherein the pre-scoring avoids scoring or cutting of the liner.

Another aspect includes the height of the contact pads above the device body being approximately 2 microns.

Also disclosed is a bonding system for bonding a discrete device to a substrate. The system includes, a bonding platform having, (i) a device holding area configured to hold the discrete device to be bonded, the discrete device including contact pads extending form a body portion, (ii) a heater arrangement configured to apply heat to the discrete device to be bonded, wherein the discrete device is heated by the heater arrangement to a temperature above a tacking temperature, (iii) a conductive tape arrangement for providing the conductive tape, the conductive tape including an adhesive layer having conductive particles (or conductive balls) within the adhesive layer and the adhesive layer carried on a liner, wherein the adhesive layer of the conductive tape is provided facing upward, (iv) a substrate holding mechanism for holding a substrate to which the discrete device is to be bonded. The system further includes a pressure application system designed to apply pressure to the discrete device, and a movement system arranged to selectively move and place the discrete device.

Another aspect includes where the bonding platform being operationally associated with an automated fixture. The automated fixture configured as an x-y-z manipulator to move the bonding platform in the x-y-z directions.

Another aspect includes the heater system and pressure application system being an air cylinder and heater attachment for applying at least one of heat and pressure during at least one of the partial bonding operation and the final bonding operation.

Another aspect includes the movement system including a vacuum nozzle for movement and placement of the discrete device.

Another aspect includes the movement system including a camera.

DETAILED DESCRIPTION

Conductive tape, such as but not limited to anisotropic conductive film (ACF), is an interconnect technology for mechanically and electrically connecting discrete devices (also called discrete components) to substrates at appropriate conductive traces. The substrates may be those such as employed in a hybrid electronic circuit. The conductive tapes typically consist of a thermosetting resin layer with embedded conductive particles on a removable liner. The conductive particles are small in relation to the contact pad area of the device and provide z-axis conductivity and are electrically insulating laterally.

The present disclosure teaches methods and systems which employ such conductive tape in a manner which reduces the number of steps in a process flow as compared to existing processes.

In one process of the present disclosure a discrete device to be bonded is preheated to a temperature slightly above the tacking temperature of the conductive tape to allow for cooling during transfer to the conductive tape. The conductive tape (e.g., ACF tape, among others) is fed from a reel onto a bonding platform with its adhesive layer side facing upward (or outward). The discrete device is removed from the heater using a vacuum chuck and appropriately sized nozzle and placed on the surface of the adhesive layer of the conductive tape. The discrete device is held in place with pressure from a pressure application system such as but not limited to an air cylinder, for a few seconds to allow the adhesive to partially cure and adhere to the contact pads of the discrete device. Thereafter the discrete device is removed from the conductive tape carrying the tacked adhesive on the contact pads. The process thus pulls the corresponding portions of the adhesive away from the conductive tape leaving the film behind. The discrete device is then transferred or moved to a selected location on the substrate and aligned, such as to contact appropriate portions of conductive traces. Pressure and heat are applied to complete the bond. No size constrained cutting of the ACF is required and a separate step to remove the protective liner is not needed.

In an alternative method the discrete device is placed directly onto the adhesive layer of the conductive tape (e.g., ACF among others) at room temperature, so the pre-heating step does need not to take place. Rather, once the discrete device is positioned on the adhesive layer a pressure application system (e.g., an air cylinder with a heater attachment) is used to apply pressure and heat to partially cure portions of the adhesive layer to tack these portions of adhesive to the contact pads of the discrete device. The contact pads of the discrete device with the partially cured adhesive portions is then transferred to the appropriate position on the substrate, aligned and subsequently bonded. In certain embodiments the heater attachment is a thermode or similar element.

Figure 1:
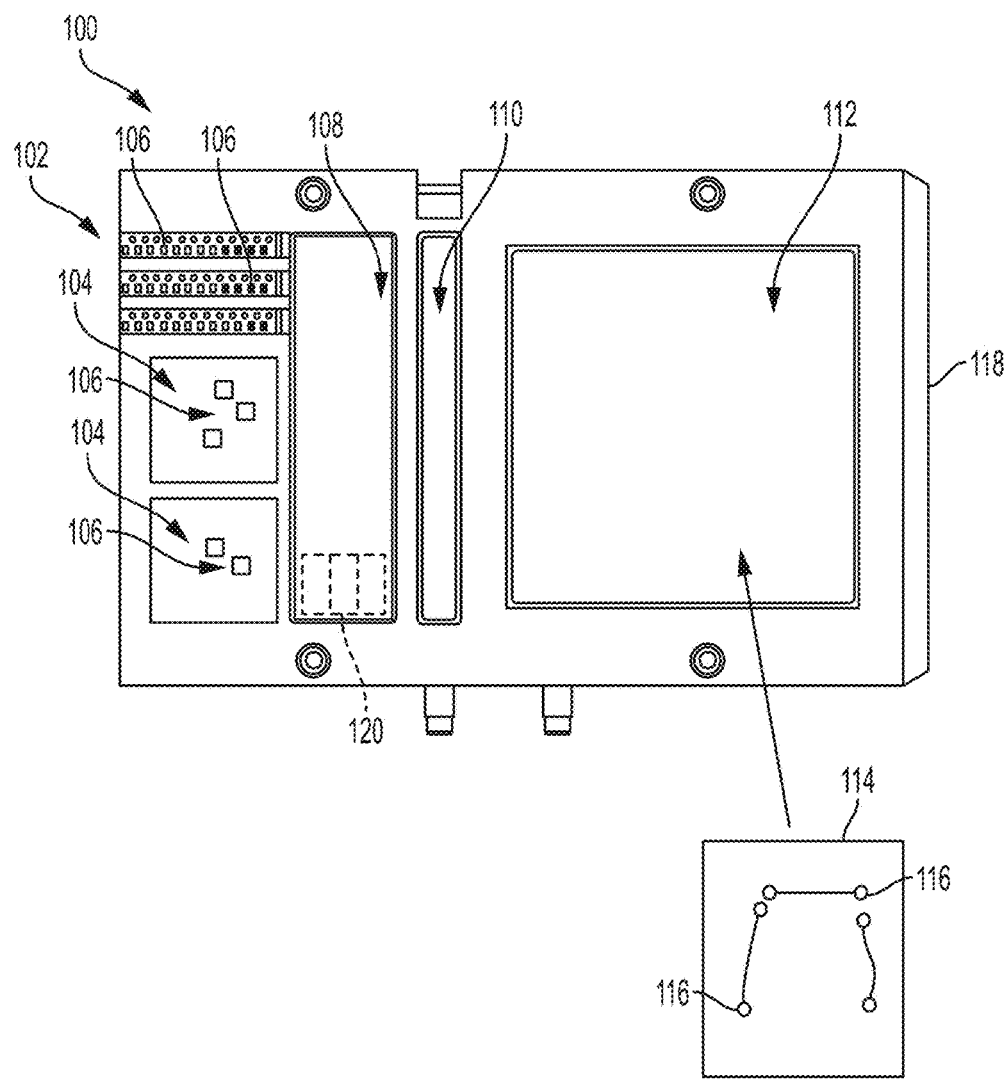
FIG. 1 illustrates a bonding platform with areas for holding devices, a pre-tack heater, an ACF vacuum stage and a substrate vacuum stage.

Turning now to FIG. 1, illustrated is a bonding platform 100 for embodiments of the present application. The bonding platform 100 provides a discrete device (or component) reel area 102 and a loose discrete device (or component) area 104, both of which carry discrete devices (or discrete components) 106. These discrete devices are understood to be packaged electronics which include conductive contact pads used to make electrical and mechanical connections, such as to conductive traces of substrates.

Also provided is a heater area 108, a conductive tape vacuum stage 110, and a substrate vacuum stage 112. Heater area 108 is optionally provided to pre-heat discrete components 106 prior to further operations. The conductive tape vacuum stage 110 in certain embodiments is designed to include a roll to roll conductive tape which has its layer of adhesive side facing upward (e.g., outward). The conductive tape may be provided in other arrangements such as sheets of tape, among other etc. A vacuum force is optionally applied to hold the discrete devices in place.

In operation substrate vacuum stage 112 carries a substrate 114, with conductive traces 116 located thereon. A vacuum force is optionally applied at the substrate stage 112 to hold the substrate 114 in place. Application of the discussed vacuum force(s) is accomplished by a vacuum generation system 118, which may be applied through a backside of the bonding platform 100 to selected area of the bonding platform, such as the conductive tape stage 110, and substrate vacuum stage 112, as known in the art. The substrate 114 may be among those such as employed in a hybrid electronic circuit or other electronic component design.

In certain embodiments the adhesive layer is pre-scored (e.g., cut) into pre-positioned areas 120. These areas 120 are sufficiently sized to receive a contact pad within in its boarders. The pre-scoring permits easier removal of those areas from the liner. This arrangement being used in processes to be discussed herein. The pre-scoring is understood to only cut through the adhesive layer and avoid cutting through of the liner.

Figure 2:
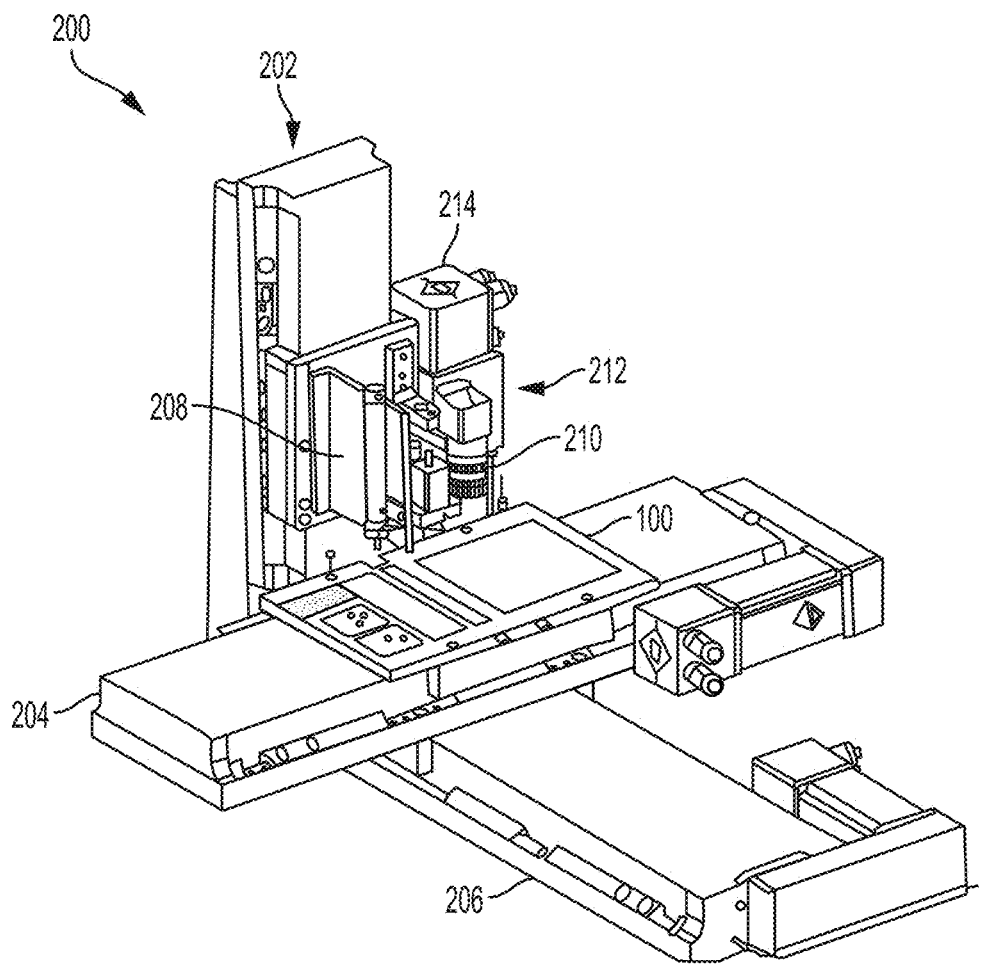
FIG. 2 illustrates the bonding platform integrated into an automated fixture in the form of an x-y-z manipulator with a camera, vacuum nozzle fixture and air cylinder with a heater attachment.

Turning to FIG. 2, illustrated is a movement system 200, including an automated fixture 202 (in one embodiment in the form of an x-y-z manipulator), which in turn is in operational attachment with bonding platform 100. More particularly the bonding platform 100 is carried on a movable arm 204 which traverses along guide arm 206. Movement system 200 also includes a movable air cylinder system 208, a movable vacuum nozzle system 210, and a movable camera system 212. In certain embodiments the air cylinder system 208 is provided with a heater element, or a separately controlled movable heater element. In certain embodiments the movement system 200 is constructed to include an on-board controller (and/or appropriate inputs/outputs) 214 to control operation of the systems of the movement system 200. The camera system 212 optionally being used in conjunction with the controller 214 for ensuring proper movement and placement of the discrete devices.

It is to be further understood that while the foregoing shows a single movement system 200, the operations discussed herein are capable of being scaled up, allowing for parallel operation and/or increased sequential operations for higher throughput. Therefore, in other embodiments a plurality of air cylinders 208, vacuum nozzles 210 and/or cameras 212, as well as additional components which assist in carrying out the concepts of the present application may be employed.

Figure 3:
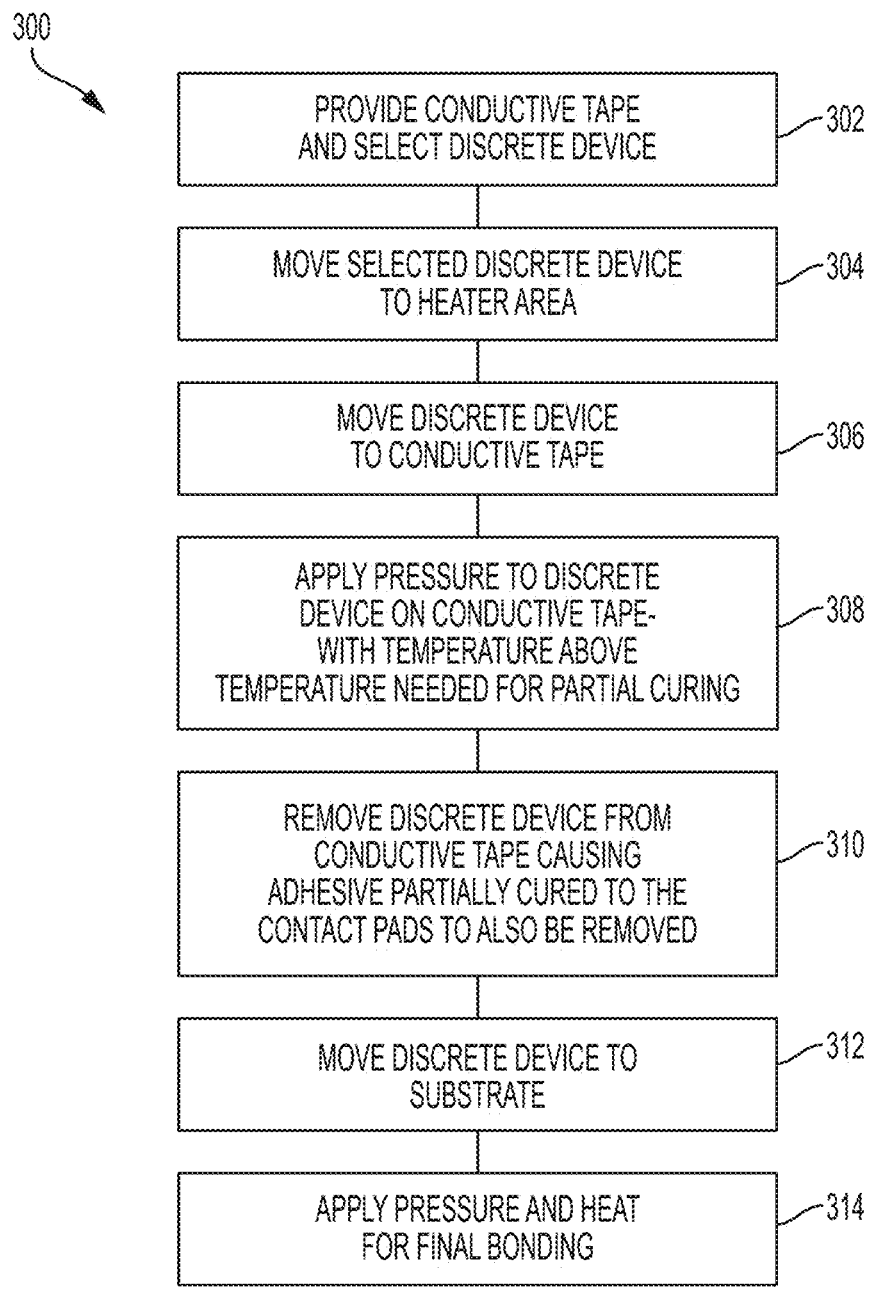
FIG. 3 illustrates a process according to the present disclosure.

Turning now to FIG. 3, shown is a process 300 in which the concepts of the present application are carried out by use of the arrangements illustrated in FIGS. 1 and 2.

Initially, in step 302, a conductive tape (e.g., anisotropic type tape) is provided and a discrete device is selected. The conductive tape includes a layer of adhesive having conductive (e.g., anisotropic) particles or balls. The adhesive layer and conductive particles or balls are carried on a removable liner. The layer of adhesive of the anisotropic tape is positioned such that the adhesive portion faces upward (or outward) with the liner located on a back side.

In step 304, the selected discrete device (e.g., one of the 106 discrete devices of FIG. 1) is moved from its initial location (e.g., area 102, and/or area 104 of FIG. 1), to the heater area (110 of FIG. 1) where the contact pads are in contact with the surface of the heater area. The movement of the discrete device is achieved in this embodiment by use of a vacuum nozzle system (e.g., 210 of FIG. 2) which applies a vacuum to a top surface of the selected discrete device and then moves the discrete device to the heater area. Once placed on the heater area, the vacuum nozzle system is disengaged from the discrete device. The heating of the discrete device includes raising the temperature at the contact pads to a level which is above the tacking temperature for the anisotropic tape. The temperature is sufficient to modify a state of at least a portion of the adhesive layer of anisotropic tape. As heat will transfer from the contact pads to the body of the discrete device, it is necessary that the discrete device is designed to withstand these heat levels without damage.

In step 306, once the discrete device (e.g., the contact pads) has reached the intended temperature the vacuum nozzle system is then again engaged with the discrete device, and the discrete device is moved to the conductive tape vacuum stage (e.g., 110 of FIG. 1) where the contact pads of the discrete device are placed onto the layer of adhesive. Once in place, the vacuum nozzle system may again be disengaged from the discrete device.

In step 308, an air cylinder system (e.g., 208 of FIG. 2) is moved into operational contact with a top surface of the discrete device and a pressure is applied to the top surface of the discrete device (e.g., 106). The pressure is applied to the discrete device for a determined time, during which the temperature at the contact pads is at or above the temperature needed for tacking, such that the contact pads and the corresponding portions of the layer of adhesive are in contact for a time sufficient for the those portions of the adhesive layer to partially cure to the conductive pad of the discrete device. In one embodiment, to achieve the partial curing, the applied pressure is approximately 1 MPa (mega-pascal), while the heat is between 60 to 90 degrees C. This operation is undertaken for a set time (e.g., approximately 2-5 seconds).

Next, in step 310, the discrete device is removed from the surface of the upward facing adhesive layer. The removal is accomplished in this embodiment by use of the vacuum nozzle system. As the discrete device is removed, portions of the layer of adhesive that have partially cured to the contact pads of the discrete device are carried with these contact pads. Thus, the portions of the layer of adhesive that correspond to the contact pads are pulled away from the film, separating those portions of the layer of adhesive from the corresponding portions of the liner. This is shown, for example, in FIGS. 6 and 7.

Turning to step 312, the vacuum nozzle system (e.g., 210 of FIG. 2) engages and moves the discrete device to a selected particular location on a substrate (i.e., a substrate located on the substrate vacuum stage 112 of FIG. 1), and places the discrete device at that location. In certain embodiments the selected location is determined by use of the camera system (e.g., camera system 214 of FIG. 2). More particularly, the contact pads having the partially cured portion of the layer of adhesive will be placed on conductive traces on the substrate.

Thereafter, in step 314, the air cylinder system with the heater attachment (e.g., 208 of FIG. 2) is brought into contact with the discrete device 106, substantially simultaneously applying heat and pressure for final bonding of the discrete device to the surface of the substrate. The temperature being between 150 to 180 degrees C., and the pressure being between 50 to 150 MPa (mega-pascal) to complete the cure of the adhesive and mechanically compress the conductive particles or balls providing electrical contact.

Figure 4:
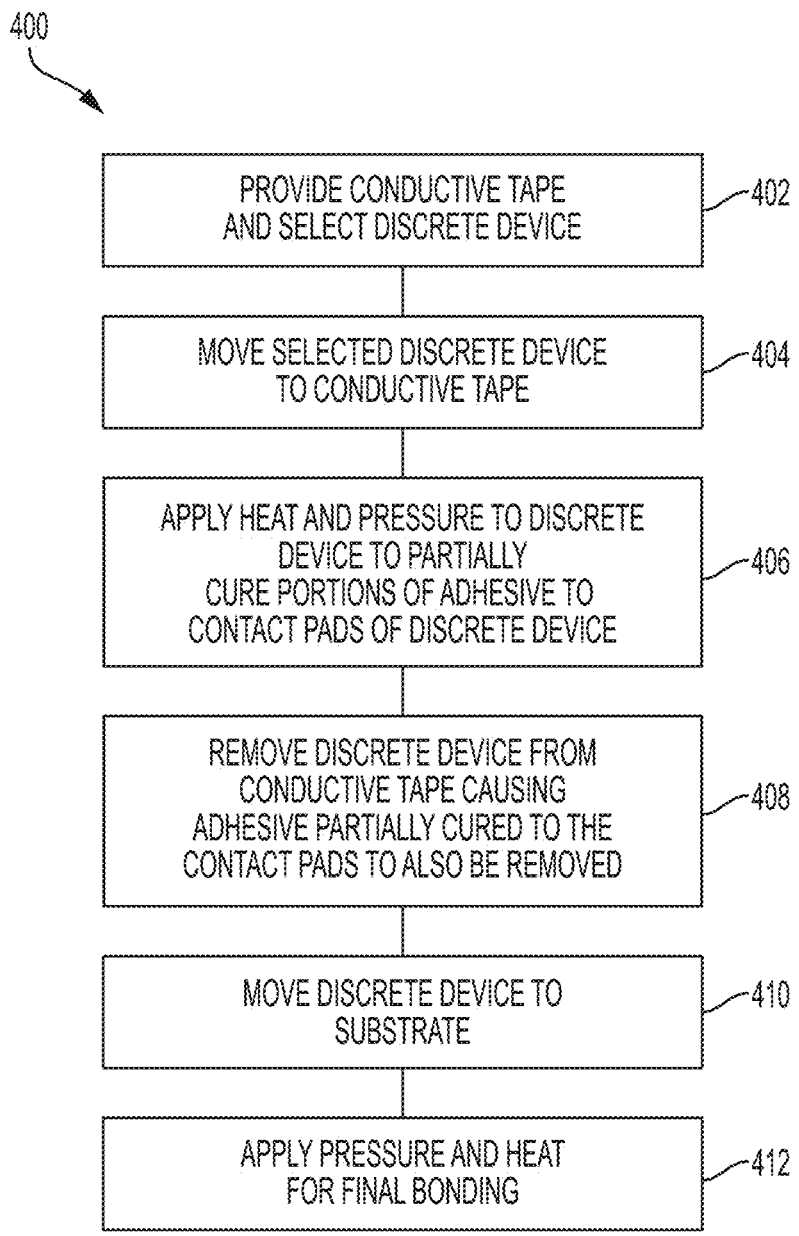
FIG. 4 illustrates another process according to the present disclosure.

Turning to FIG. 4, illustrated is another embodiment of a process 400 to bond a discrete device to a substrate. Various aspects of the process 400 of FIG. 4 are similar to process of FIG. 3. For example, in step 402, a conductive tape is provided and a discrete device is selected. Again, the conductive tape includes a layer of adhesive having conductive (e.g., anisotropic) particles or balls within the adhesive layer, which is carried on a liner. The layer of adhesive is positioned in an upward (or outward) facing arrangement.

In step 404 the contact pads of discrete device 106 are placed on the upward facing adhesive layer of the conductive tape (110 of FIG. 1), such as by use of the vacuum nozzle system (210 of FIG. 2). This process step is distinct from the process of FIG. 3, in particular, it does not require preheating of the discrete device 106 at a heater area 108. Following placement of the discrete device the vacuum nozzle system is disengaged.

Next, in step 406, an air cylinder system which includes a heater add-on element (or there is a separately controlled heating element) applies heat and pressure to the discrete device. The process provides simultaneous and/or substantially simultaneous pressure and heat to the discrete device. The applied pressure and heat is sufficient to partial cure portions of the adhesive layer to the contact pads.

Next, in step 408 once the portions of the adhesive layer are partially cured to the contact pads in step 406, the air cylinder and heating element are removed. Then the vacuum nozzle system (210 of FIG. 2) is placed in contact with the discrete device, and is used to remove the discrete device from the upward facing layer of adhesive. Removal results in the partially cured portions of the adhesive layer to be pulled away from the liner of the conductive tape. Such concept is shown by image 600 of FIG. 6 and 700 of FIG. 7. Next, in step 410, the discrete device is positioned, (such as by use of the vacuum nozzle system) onto the substrate. The contact pads are carrying portions of the layer of adhesive which is at partially cured to the contact pads. This arrangement is placed onto the surface of the substrate at a desired location, such as on a conductive trace of the substrate. The placement being assisted by use of the camera system.

Thereafter, in step 412, the vacuum nozzle system is released from the discrete device on the substrate, and the air cylinder and heating element is then again provided to apply appropriate heat and pressure for a sufficient amount of time to obtain a final bonding of the discrete device to the surface of the substrate. The amount of pressure, heat and time as discussed in connection with the process of FIG. 3.

It is mentioned that while the heat has been described as being applied at the top surface and at the contact pads, application of the heat may be made at other locations also dependent upon the implementation and the particular discrete device. Further, it may be possible to apply the heat through a back-side of the conductive tape area and/or the substrate area. However, in these situations an issue to be addressed is the unwanted spreading of the heat though area of the conductive tape line, and the back-side of the substrate.

Also, while vacuum nozzle system has been described to move the discrete device, other mechanisms may also be employed. Still further mechanisms other than the air cylinder system may be used to apply pressure to the discrete device.

Still further, while the sequential movement of a single discrete device through the system has been described, the processes disclosed herein may be used to operate on multiple discrete devices in an ongoing manner. For example, but not limited thereto, in the process of FIG. 3, multiple discrete devices may be taken from the holding areas 102, 103 and placed on the heater area such that multiple discrete devices are at the heater area at the same time. Similarly, in the process of FIG. 4, multiple discrete devices may be taken from the holding areas 102, 103 and placed on the conductive tape such that multiple discrete devices are on the conductive tape at the same time. Again the forgoing are examples of alternatives and are in no way limiting to other alternatives.

Figure 5:
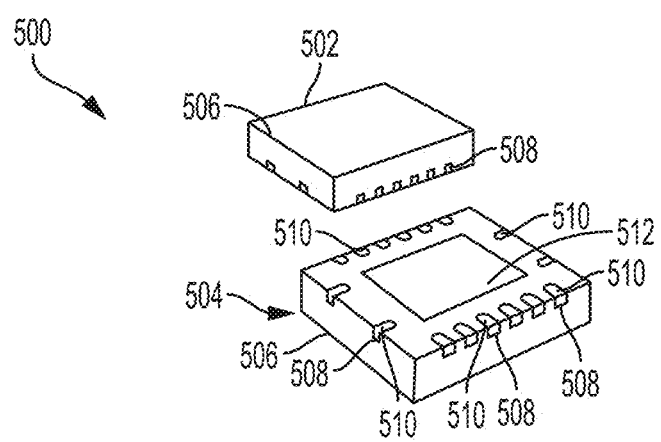
FIG. 5 illustrates an active device bonded using this technique. We also successfully demonstrated the process with 0805 and 1206 size resistors.

Turning to FIG. 5, illustrated is a particular discrete device 500 which has been employed in bonding experiments undertaken in connection with the present concepts. Discrete device 500 is illustrated with a top view 502 and a side oblique view 504. Shown is a body portion 506 from which a number of contact pads 508 extend approximately 2 to 20 microns, and upper surfaces 510 of the contact pads 508 that are coated with a portion of the layer of adhesive of a conductive tape. The coating being accomplished by processes such as discussed herein. Also shown is a ground pad 512. In one example, the device is a Texas Instrument Decoder/Demultiplexer Serial No. SN 74LVC138ARGYR.

Figure 6:
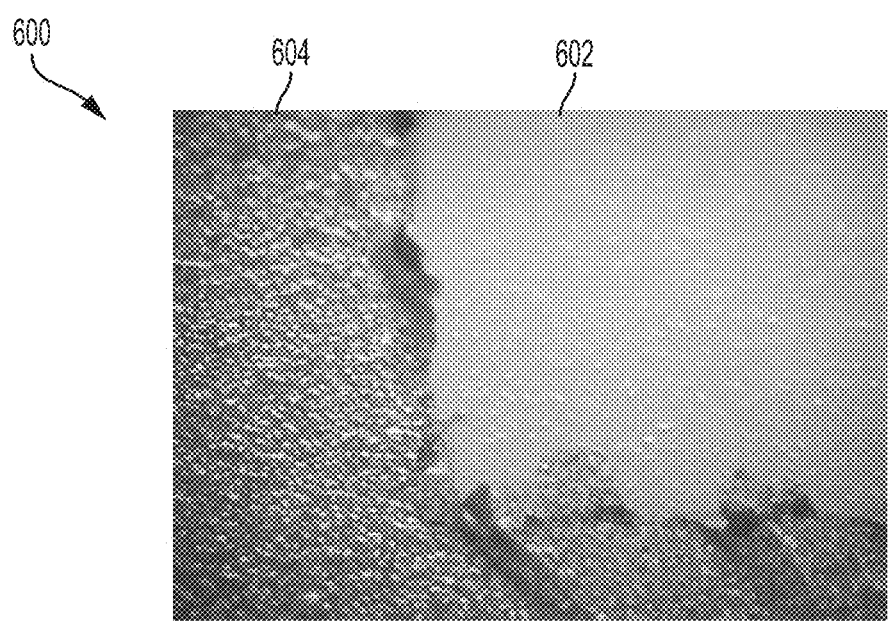
FIG. 6 illustrates the removal of ACF adhesive and conductive particles or balls when the device is removed from the tape after tacking.

FIG. 6, is a magnified image 600 showing an area of the conductive tape 602 after removal of a portion of the adhesive layer that was partially cured to the contact pads. As can be seen, film 602 remains after the adhesive in this area has been removed; whereas, the adhesive layer 604 is maintained at locations where the contact pads were not in contact, and therefore the adhesive layer remains.

Figure 7:
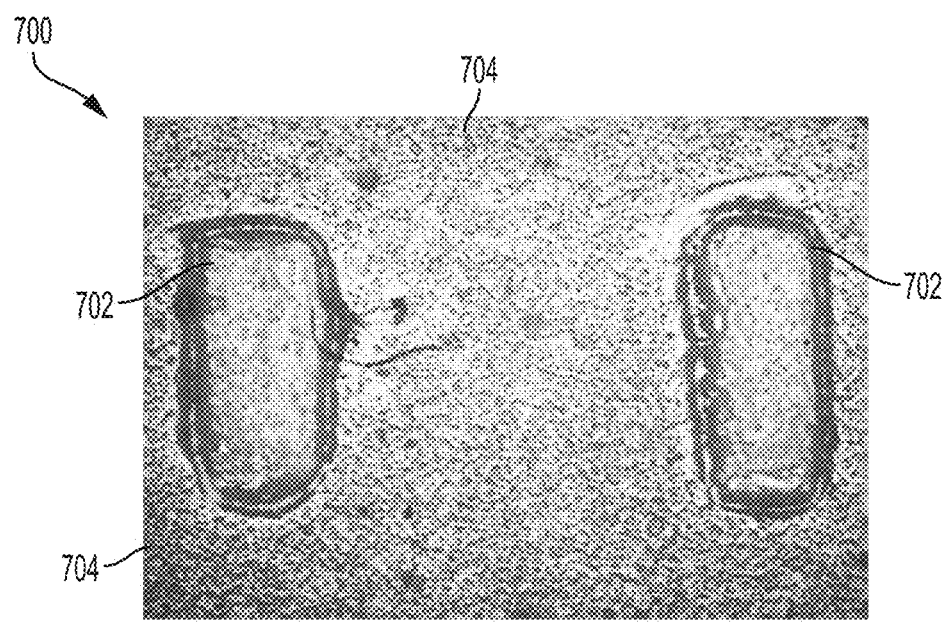
FIG. 7 illustrates the removal of ACF adhesive and conductive particles balls when an 0805 resistor is removed from the tape after tacking.

Similarly, the image 700 of FIG. 7 illustrates locations corresponding to where the portions of the adhesive layer which has been removed with the contact pads leaving the liner 702, and portion where the adhesive layer 704 is maintained. The image 700, being for a 0805 resistor. Area 702 thus corresponds to locations where the contact pads were positioned, surrounded by remaining adhesive layer 704. This illustrates the portion of the adhesive layer that has been removed and transferred with the discrete device surrounded by remaining areas of the adhesive layer 704.

Figure 8:
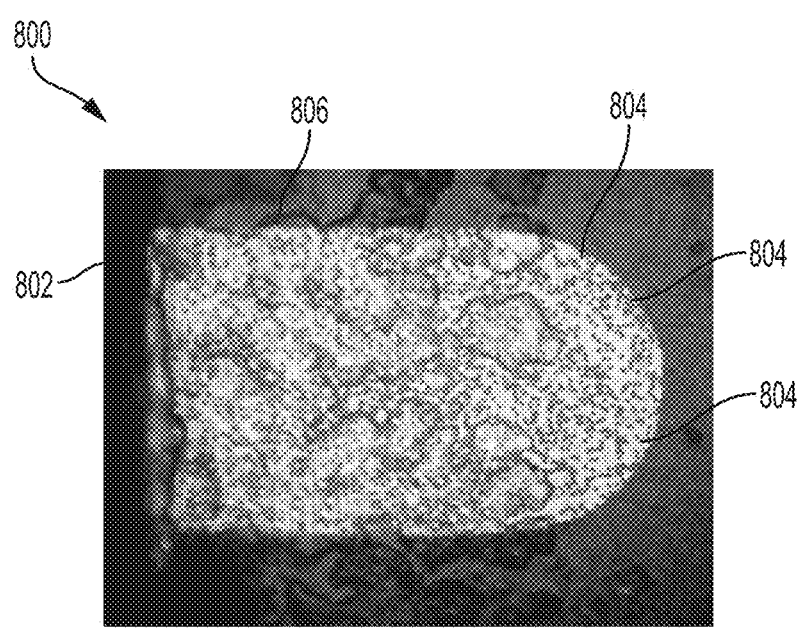
FIG. 8 illustrates a contact pad of a discrete device after tacking and removal from the ACF tape showing a uniform distribution of conductive particles or balls over the surface of the contact pad.

Finally, with attention to image 800 of FIG. 8 depicted is an upper (or outer) surface of a contact pad 802 after tacking and removal from the conductive tape, The image 800 shows conductive balls 804 embedded in the adhesive 806 being carried on the contact pad 802. In some embodiments the adhesive is substantially clear.

The forgoing has thus described methods and systems which operate to eliminate steps in existing processes for mounting (e.g., bonding) a discrete device to an electronic (e.g., hybrid) circuit using conductive tape (e.g., anisotropic film), and thereby shortens the time required to attach each device. The method includes placing a discrete device onto the conductive tape and partially curing portion of the adhesive. The discrete device is then removed from the conductive tape along with the adhesive and conductive particles which have been transferred onto the contact pads of the discrete device. The discrete device is then placed on the substrate and aligned. Pressure and heat are applied to complete the bond.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A method of bonding a discrete device to a substrate, the discrete device having contact pads extending from a body portion, and the bonding using a conductive tape, the method comprising:

providing the conductive tape having a layer of adhesive including conductive particles within the layer of adhesive, the layer of adhesive carried on a liner, wherein the layer of adhesive of the conductive tape faces upward;

placing the contact pads of the discrete device on the upward facing layer of adhesive of the conductive tape;

applying pressure and heat to the discrete device located on the layer of adhesive of the conductive tape, the pressure being sufficient to move the contact pads into the layer of adhesive, and the heat raising the contact pads to a temperature above a tacking temperature of the conductive tape sufficient to alter portions of the layer of adhesive corresponding to areas of the contact pads, wherein the portions of the layer of adhesive corresponding to the areas of the contact pads partially tack the portions of the layer of adhesive to the contact pads;

removing the discrete device from the upward facing layer of adhesive of the conductive tape, wherein the portions of the layer of adhesive that have partially cured to the contact pads of the discrete device are carried with the contact pads, and are removed from the liner of the conductive tape;

positioning the discrete device with the contact pads carrying the portions of the partially cured adhesive layer onto a surface of a substrate, wherein the partially cured adhesive layer substantially covers an entire surface of each of the contact pads sufficient to provide an electrical connection between surfaces of the contact pads and the substrate, wherein the substrate includes conductive traces; and applying heat and pressure to the discrete device to complete bonding of the contact pads of the discrete device to the surface of the substrate.

2. The method according to claim 1 wherein the conductive tape is an anisotropic conductive film.

3. The method according to claim 1 wherein the heat is 60 degrees C. to 90 degrees C. and the pressure applied to the device is approximately 1 MPa to partially cure the adhesive.

4. The method according to claim 1 wherein the heat is between 150 degrees C. to 180 degrees C. and the pressure applied to the device is between 2 to 5 MPa to complete the bonding and curing operation.

5. A method of bonding a discrete device to a substrate, the discrete device having contact pads extending from a body portion, and the bonding using a conductive tape, the method comprising:

providing the conductive tape having a layer of adhesive including conductive particles within the layer of adhesive, the layer of adhesive carried on a liner, wherein the layer of adhesive of the conductive tape faces upward, further including pre-scoring the adhesive layer into pre-positioned locations to match the contact pads of the device, wherein the pre-scoring avoids scoring of the liner;

placing the contact pads of the discrete device on the upward facing layer of adhesive of the conductive tape;

applying pressure and heat to the discrete device located on the layer of adhesive of the conductive tape, the pressure being sufficient to move the contact pads into the layer of adhesive, and the heat raising the contact pads to a temperature above a tacking temperature of the conductive tape sufficient to alter portions of the layer of adhesive corresponding to areas of the contact pads, wherein the portions of the layer of adhesive corresponding to the areas of the contact pads partially tack the portions of the layer of adhesive to the contact pads;

removing the discrete device from the upward facing layer of adhesive of the conductive tape, wherein the portions of the layer of adhesive that have partially cured to the contact pads of the discrete device are carried with the contact pads, and are removed from the liner of the conductive tape;

positioning the discrete device with the contact pads carrying the portions of the partially cured adhesive layer onto a surface of a substrate.

6. The method according to claim 1 wherein the contact pads height above the device is approximately 2 microns.

7. A method of bonding a discrete device to a substrate, the discrete device having contact pads extending from a body portion, and the bonding a using conductive tape, the method comprising:

providing the conductive tape having a layer of adhesive including conductive particles within the layer of adhesive, the layer of adhesive carried on a liner, wherein the layer of adhesive of the conductive tape faces upward;

heating the discrete device at a heating area, the heating raising the contact pads to a temperature above a tacking temperature of the conductive tape;

removing the heated discrete device from the heating area;

placing the contact pads of the heated discrete device on the upward facing layer of adhesive of the conductive tape;

applying a pressure to the heated discrete device for a determined time such that the contact pads and the layer of adhesive are in contact, wherein the temperature of the contact pads is sufficient to modify portions of the layer of the adhesive of the conductive tape associated with the contact pads, wherein the portions of the layer of adhesive partially cure to the contact pads of the discrete device;

removing the discrete device from the upward facing layer of adhesive of the conductive tape, wherein the portions of the layer of adhesive that have partially cured to the contact pads of the discrete device are carried with the contact pads, and are removed from the liner of the conductive tape;

positioning the discrete device with the contact pads carrying the portions of the partially cured adhesive layer onto a surface of a substrate; and applying heat and pressure to the discrete device to complete bonding of the contact pads of the discrete device to the surface of the substrate.

8. The method according to claim 7 wherein the conductive tape is an anisotropic conductive film.

9. The method according to claim 7 wherein the partially cured adhesive layer substantially covers an entire surface of each of the contact pads sufficient to provide an electrical connection between surfaces of the contact pads and the substrate, wherein the substrate includes conductive traces.

10. The method according to claim 7 wherein the temperature is between 60 degrees C. to 90 degrees C., and the pressure applied to the device is between 1 MPa to 3 MPa in order to partially cure the adhesive.

11. The method according to claim 7 wherein the temperature is between 150 degrees C. to 180 degrees C., and the pressure applied to the device is between 50 MPa to 150 MPa to complete the bonding operation.

12. The method according to claim 7 further including pre-scoring the adhesive layer into pre-positioned locations to match the contact pads of the device, wherein the pre-scoring avoids scoring of the liner.

13. The method according to claim 7 wherein a height of the contact pads above the device body is approximately 2 microns.

14. The method according to claim 5 wherein the conductive tape is an anisotropic conductive film.

15. The method according to claim 5 wherein the heat is 60 degrees C. to 90 degrees C. and the pressure applied to the device is approximately 1 MPa to partially cure the adhesive.

16. The method according to claim 5 wherein the heat is between 150 degrees C. to 180 degrees C. and the pressure applied to the device is between 2 to 5 MPa to complete the bonding and curing operation.

17. The method according to claim 5 further including pre-scoring the adhesive layer into pre-positioned locations to match the contact pads of the device, wherein the pre-scoring avoids scoring of the liner.

18. The method according to claim 5 wherein the contact pads height above the device is approximately 2 microns.

\* \* \* \* \*